United States Patent
Yeh

(10) Patent No.: US 7,602,060 B2
(45) Date of Patent: Oct. 13, 2009

(54) HEAT SPREADER IN A FLIP CHIP PACKAGE

(75) Inventor: Kean Hock Yeh, Kedah (MY)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 11/767,634

(22) Filed: Jun. 25, 2007

(65) Prior Publication Data

US 2008/0315405 A1 Dec. 25, 2008

(51) Int. Cl.
*H01L 23/36* (2006.01)
*H01L 21/56* (2006.01)

(52) U.S. Cl. .............. 257/718; 257/E23.101; 257/E21.505; 257/737; 257/738; 257/778; 257/712; 257/717; 257/720; 257/713

(58) Field of Classification Search .......... 257/718, 257/E23.101, E21.505, 737, 738, 778, 678, 257/712, 713, 675, 717, 720; 438/113
See application file for complete search history.

(56) References Cited

U.S. PATENT DOCUMENTS 6,212,074 B1 * 4/2001 Gonsalves et al. .......... 361/717
2004/0036172 A1 * 2/2004 Azuma et al. ............... 257/738
2004/0046241 A1 * 3/2004 Combs et al. ............... 257/678
2004/0212080 A1 * 10/2004 Chen et al. .................. 257/712
2005/0056928 A1 * 3/2005 Kwon et al. ................. 257/718
2005/0167849 A1 * 8/2005 Sato ........................... 257/778
2006/0231944 A1 * 10/2006 Huang et al. ................ 257/706
2007/0176289 A1 * 8/2007 Lee et al. .................... 257/737
2007/0270536 A1 * 11/2007 Sachdev et al. ............. 524/440
2007/0298603 A1 * 12/2007 Rebibis et al. .............. 438/613

\* cited by examiner

*Primary Examiner*—Alexander O Williams
(74) *Attorney, Agent, or Firm*—Blakely, Sokoloff, Taylor & Zafman LLP

(57) ABSTRACT

A microelectronic package with enhanced thermal management using an embedded heat spreader is disclosed. The microelectronic package comprises a die mounted on a substrate, a thermal interface material disposed in thermal conductive communication with the die and a heat spreader disposed in thermal conductive communication with the thermal interface material. A mold material is provided to enclose the die and the thermal interface material, and partially embedding the heat spreader to expose at least a surface of the heat spreader to an ambient environment. The heat spreader may include an anchor portion to reinforce coupling of the heat spreader to the mold material. If and when required, the heat spreader may be coupled in thermal communication with an external heat sink.

12 Claims, 4 Drawing Sheets

HEAT SPREADER IN A FLIP CHIP PACKAGE

BACKGROUND

1. Technical Field

Embodiments of the invention relate to an embedded heat spreader in a flip chip package to enhance thermal management of the package and methods of manufacturing the same.

2. Description of Related Art

As packaging density of microelectronic devices increases with technology developments, manufacturers are continually shrinking the sizes of microelectronic devices to satisfy increasing demand for smaller electronic devices. Along with the miniaturization trend, heat dissipation requirements are increased.

A Flip Chip Molded Matrix Array Package (FCMMAP), for example, usually comprises a microelectronic die which may be flip-chip mounted on a substrate using joining members, and sealed with an underfill before encapsulating the assembly with a mold material. Although current device applications may not result in high heat dissipation, expectations may change as microelectronic device performance rapidly increases at the same time as device miniaturization. Accordingly, enhanced thermal management in microelectronic devices is highly desired.

DETAILED DESCRIPTION OF ILLUSTRATIVE EMBODIMENTS

Figure 1A:
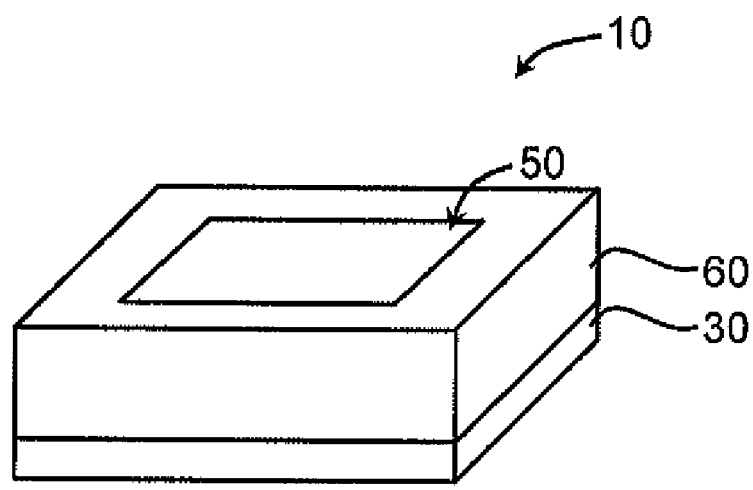
FIG. 1A is a perspective view of a microelectronic package according to one embodiment of the invention.

In the following description, numerous specific details are set forth in order to provide a thorough understanding of various illustrative embodiments of the present invention. It will be understood, however, to one skilled in the art, that embodiments of the present invention may be practiced without some or all of these specific details. In other instances, well known process operations have not been described in detail in order not to unnecessarily obscure pertinent aspects of embodiments being described. In the drawings, like reference numerals refer to same or similar functionalities or features throughout the several views.

Figure 1B:
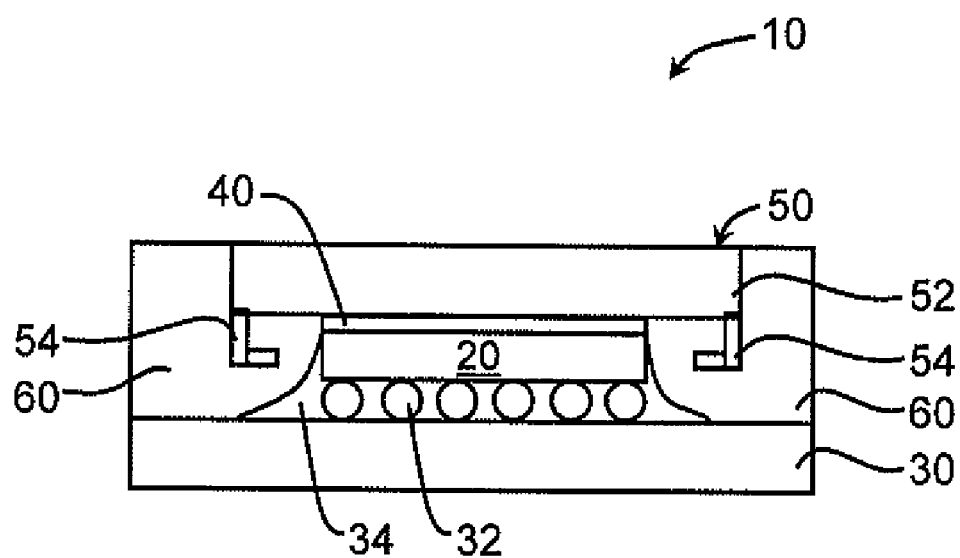
FIG. 1B is a cross-sectional view of the microelectronic package of FIG. 1A.

Reference is made to FIG. 1A illustrating a perspective view of a microelectronic package 10 according to one embodiment of the invention, and to FIG. 1B illustrating a cross-sectional view of the microelectronic package 10 of FIG. 1A. A microelectronic package 10 may comprise a die 20 having a first surface containing a plurality of electrical contacts in electrical communication with active circuitry for an intended application, and a second surface generally opposed to the first surface. The first surface of the die 20 may be mounted in electrical coupling with a carrier substrate 30 using joining members, such as solder bumps 32, by flip chip mounting the first surface of the die 20 with the substrate 30. An underfill material 34, such as an epoxy resin (e.g. Hitachi C160, Hitachi 1266, SEC), may be filled and sealed between the die 20 and the substrate 30 to provide mechanical support, electrical isolation of the joining members, and to protect the active circuitry from the environment. In addition, the substrate 30 may electrically couple the microelectronic die 20 to an external circuit or printed circuit board (not shown) by solder balls, or through sockets, or by other interconnect schemes. Examples of suitable materials for the substrate 30 includes, but are not limited to, FR4 (an epoxy resin bonded glass fabric) and an organic substrate (e.g. comprising a core layer of glass epoxy or glass-polyimide based, copper trace and resin).

A thermal interface material 40 (or first thermal interface material) may be disposed in thermal conductive communication with the second surface of the die 20. In addition, a heat spreader 50 may be disposed in thermal conductive communication with the thermal interface material 40. Providing a thermal interface material 40 as an interface between the die 20 and the heat spreader 50 is advantageous in various aspects, including but not limited to, improved thermal conductivity of the finished package 10 and reduced risk of die damage. Because surfaces of the die 20 and the heat spreader 50 are uneven, juxtaposing the heat spreader 50 directly to the die 20 would result in increased thermal resistance of the composite assembly. Interposing a suitable thermal interface material 40 therebetween evens out contact surfaces of the heat spreader 50 and the die 20 to improve thermal conductivity. Also, die damage, e.g. cracking and chipping, may occur during molding process if the die 20 were directly bonded to the heat spreader 50. Further, die damage may arise due to variations in thickness of the heat spreader 50 and the die 20, and in some situations, resulting in excessive pressure on the die 20 by the heat spreader 50. Providing a thermal interface material 40 between the heat spreader 50 and the die 20 therefore alleviates pressure exerted by the heat spreader 50 on the die 20. Examples of suitable thermal interface material 40 include, but are not limited to, polymer-solder hybrid thermal interface material and indium foil.

The suitable thermal interface material 40 should have high thermal conductivity and should improve thermal contact when disposed between the heat spreader 50 and the die 20. The thermal interface material 40 may be subject to further processing, e.g. heating, to couple to both the heat spreader 50 and the die 20. In this connection, the thermal interface material should easily fuse with the heat spreader as well as the die. Further, the melting point of the thermal interface material should also be lower than the melting points of the heat spreader 50 and the die 20.

The heat spreader 50 may comprise a heat dissipation portion 52 and an anchor portion 54. The heat dissipation portion 52 may have a first surface in thermal communication with the thermal interface material 40, and a second surface which may be exposed to an ambient environment. The extent of material between the first and the second surfaces of the heat spreader 50 forms its thickness. Thickness of the heat spreader 50 depends on several factors including, but not limited to, heat dissipation rate of the die 20, thermal conductivity of the heat spreader material, presence of an external heat sink, required size of the finished package 10, and surface area of the die 20. Examples of suitable heat spreader material include, but are not limited to, copper and its alloy, aluminum alloy, any material with high thermal conductivity.

Figure 2A:
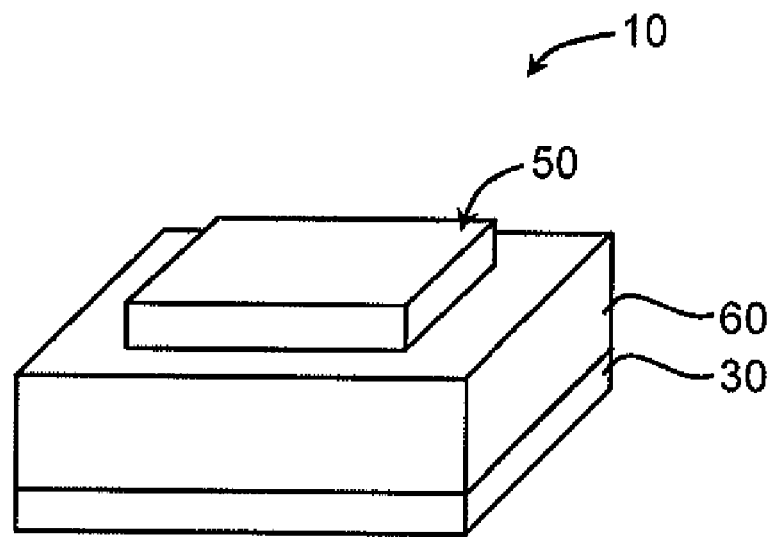
FIG. 2A is a perspective view of a microelectronic package according to one embodiment of the invention.
Figure 2B:
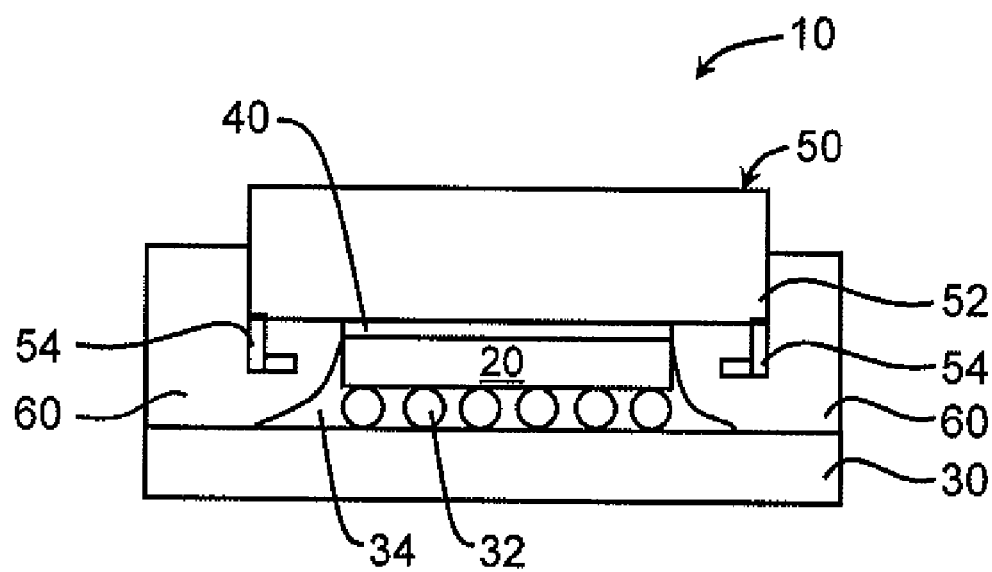
FIG. 2B is a cross-sectional view of the microelectronic package of FIG. 2A.

The anchor portion 54 of the heat spreader 50 is configured to reinforce embedding or fastening of the heat spreader 50 to an encapsulant material or mold material 60. To this purpose, the anchor portion 54 may be constructed in various ways, including, but not limited to the illustrations in associated drawings. In FIGS. 1B and 2B, the anchor portion 54 comprises an arm extending from the heat dissipating portion 52 and terminating in an angled portion to form a recess therein in which a mold encapsulant material 60 may be injected thereto. Alternatively, the anchor portion 54 may be constructed in other forms or shapes, with or without an angled portion, to increase surface area of the heat spreader 50 embedded in the mold material 60 and thereby to reinforce fastening of the heat spreader 50 to the finished package 10.

The mold encapsulant material 60 is to secure the composite assembly of the thermal interface material 40, heat spreader 50, die 20 and substrate 30. The mold material 60 may partially enclose the composite assembly to expose at least a surface of the heat spreader 50. More specifically, the mold material 60 may enclose the die 20 and the thermal interface material 40, and partially enclose the heat spreader 50 to expose a surface of the heat spreader 50. The exposed surface enables heat generated from the die 20 to dissipate into an ambient environment. Optionally, an external heat sink may be attached to the exposed surface of the heat spreader 50 as an additional thermal conductive channel. The exposed surface of the heat spreader 50 may be substantially flush with an adjacent surface of the encapsulation material (FIG. 1B). If desired, the exposed surface of the heat spreader 50 may protrude from an adjacent surface of the encapsulation material (FIG. 2B). The protrusion increases surface area exposed to the ambient environment and therefore increases heat dissipation capability. Suitable mold materials 60 include, but are not limited to, lead-free mold compound, epoxy molding compound, and thermoset plastic.

Figure 3A:
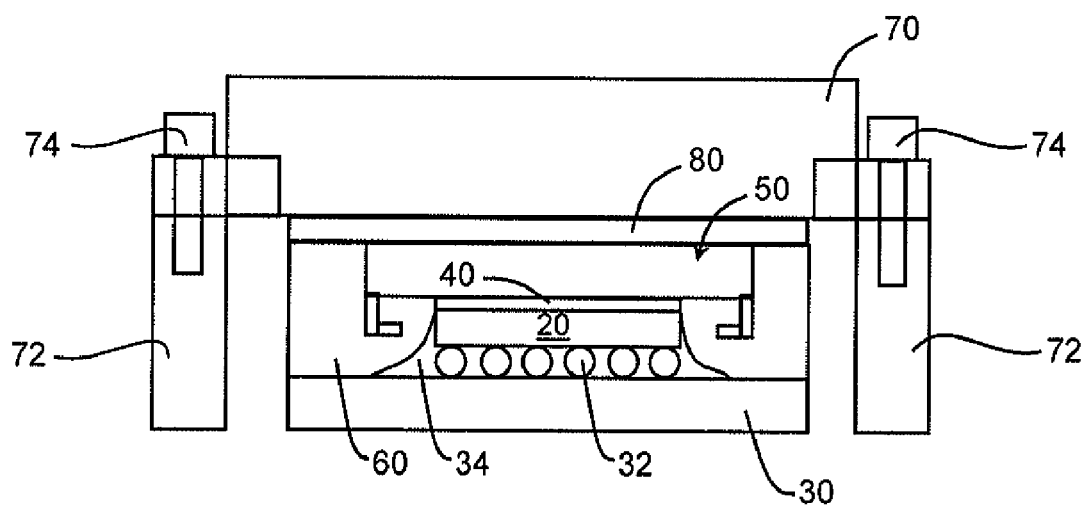
FIG. 3A is a cross-sectional view of an external heat sink coupled to the microelectronic package of FIG. 1B using a socket.
Figure 3B:
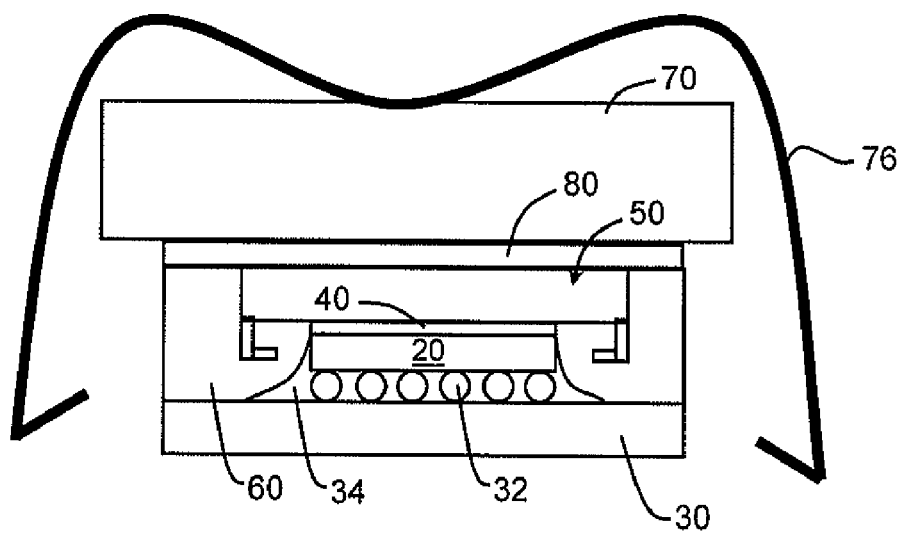
FIG. 3B is a cross-sectional view of an external heat sink coupled to the microelectronic package of FIG. 1B using a clip.

If and when required, one or more external heat sinks may be coupled in thermal communication with the heat spreader 50 via a layer of thermal interface material 80 (second thermal interface material) to bond the heat sink 70 to the heat spreader 50. A securing device may further be used to secure the heat sink 70 to the microelectronic package 10. Such a securing device may be a clip or a socket configured to receive a mounting screw. FIG. 3A is a cross-sectional view of an external heat sink 70 coupled to the microelectronic package of FIG. 1B using a socket 72, while FIG. 3B is a cross-sectional view of an external heat sink 70 coupled to the microelectronic package of FIG. 1B using a clip 76. While not illustrated, it is to be appreciated that an external heat sink 70 may be coupled to the heat spreader 50 in the embodiment of FIG. 2B in a similar manner.

In FIG. 3A, a heat sink 70 is coupled in thermal communication with the heat spreader 50 through a thermal interface material 80 interposed therebetween. As surfaces of the heat spreader 50 and the heat sink 70 are uneven, interposing a thermal interface material therebetween evens out contact surfaces of the heat spreader 50 and the heat sink 70 to improve thermal conductivity. The heat sink 70 may further be supported by mounting on a socket 72 using screws 74.

In FIG. 3B, a heat sink 70 coupled in thermal communication with the heat spreader 50 through a thermal interface material 80 interposed therebetween for similar reasons. A clip 76 may be provided to secure the heat sink 70 with the microelectronic package 10 to a circuit board or socket.

Figure 4:
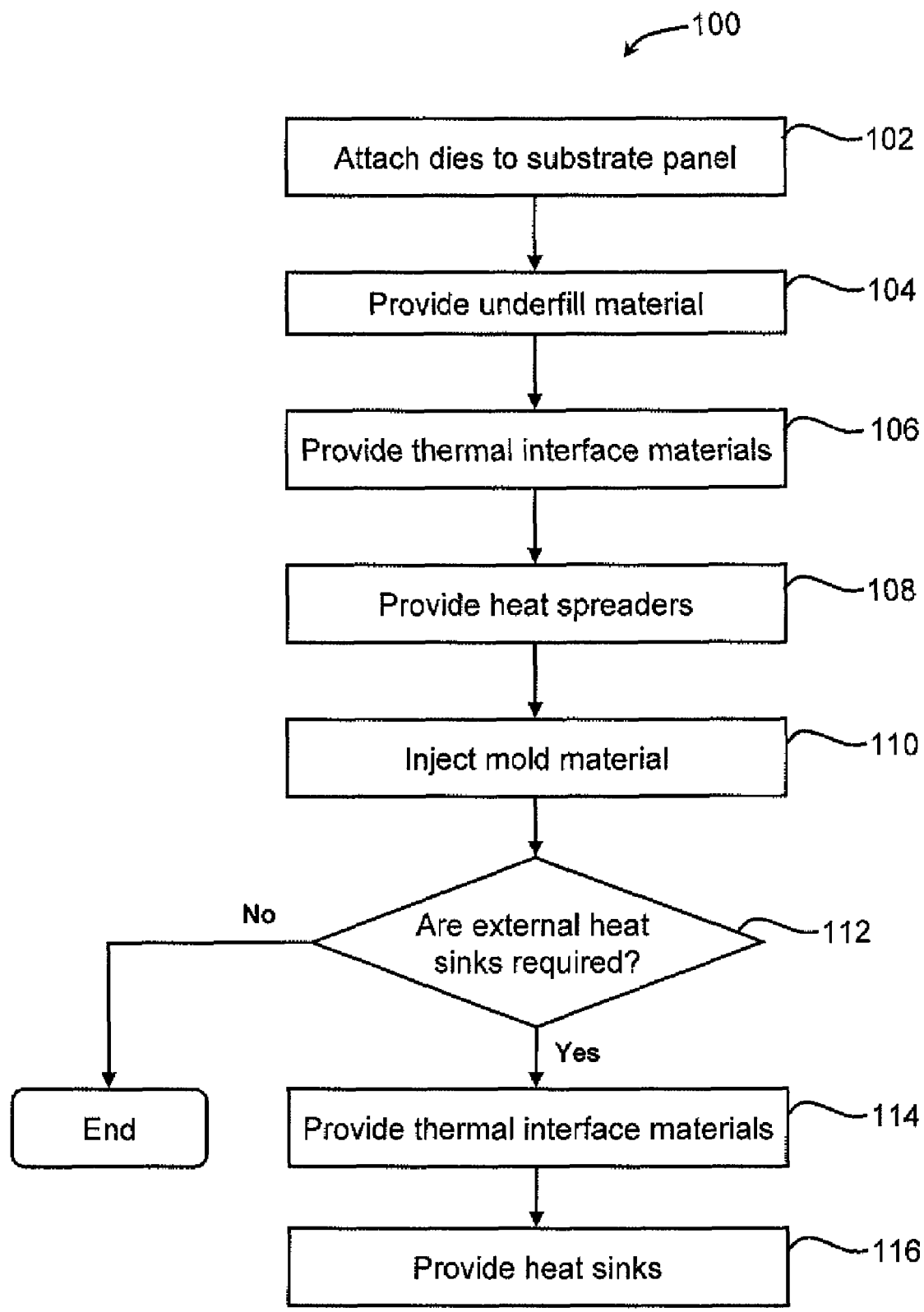
FIG. 4 is a process sequence for manufacturing an embodiment of the invention.

An exemplary method of manufacturing one embodiment of microelectronic flip chip packages having heat spreaders embedded therein is described with reference to a flow sequence 100 illustrated in FIG. 4. A substrate panel may be provided to which a plurality of microelectronic dies 20 may be attached thereto. Each microelectronic die includes a first surface having a plurality of electrical contacts in electrical communication with active circuitry of the die, and a second surface generally opposed to the first surface. The first surface of each die is electrically coupled to the substrate panel using joining members, such as solder bumps, by flip chip mounting on the substrate panel at block 102. An underfill material, such as an epoxy resin, is provided to fill and seal the space between each die and the substrate panel at block 104. A thermal interface material 40 may be disposed to overlay the second surface of each die at block 106. An appropriate thickness of the thermal interface materials 40 is disposed to improve thermal contact between the dies and their corresponding heat spreaders without unduly increasing load pressure on the dies. The thermal interface material 40 may be provided in liquid or in solid form, e.g. polymer-solder hybrid thermal interface material, indium foil. A heat spreader 50 may then be disposed to overlay each thermal interface material 40 at block 108. The heat spreaders 50 may be prefabricated, such as by forging at low temperature or stamping. Further, the heat spreaders 50 may be provided as separate pieces or in a panel (or array) form, the latter of which may have to be singulated together with the substrate panel later in the process sequence.

At this stage, the composite assembly of substrate panel, microelectronic dies, thermal interface materials 40 and heat spreaders 50 may be cured to amalgamate the composite assembly. More particularly, the composite assembly may be heated to suitable temperatures (e.g. about 150° C. to 180° C. depending on the thermal interface material) to melt the thermal interface material 40. Upon cooling of the molten thermal interface material 40, the thermal interface materials 40 bond with the heat spreaders 50 as well as the microelectronic dies 20 to improve thermal contact between the heat spreaders 50 and the dies 20.

Subsequently, the assembly may be disposed in a transfer mold at block 110 where a layer of mold encapsulant material 60 is injected in the mold cavity to fill up the space between the substrate panel and the heat spreaders 50. The mold material 60 also fills up recess formed by each anchor portion 54 of the heat spreaders 50 to reinforce embedding of the heat spreaders 50 to the mold material 60. An isolation material, e.g. plastic sheet, may be disposed on top of each heat spreader 50 before injecting the mold material 60. Overlaying the heat spreader 50 with an isolation material is to prevent the mold material 60 from coming into contact with the top surface of heat spreader 50. After molding is completed, the heat spreaders 50 are embedded in the mold material 60 with at least a surface exposed to an ambient environment. The dies 20 and thermal interface materials 40 may, however, be fully encapsulated and therefore protected from the environment. Post-molding processes may include sawing or singulating the molded assembly into individual microelectronic packages by cutting the substrate panel in the areas between the dies.

In the above-described process, curing of the thermal interface material 40 is carried out before molding. However, depending on process requirements, curing may instead be carried out after molding.

If an external heat sink is required (block 112), a thermal interface material 80 may first be disposed or provided on each heat spreader at block 114 before a heat sink 70 is disposed on each thermal interface material 80 at block 116. Examples of suitable materials for the thermal interface material 80 include, but are not limited to, a phase change material, e.g. boron nitride filled film, and a thermal conductive gap filler, e.g. boron nitride base, alumina base. As the molded assembly has been singulated into individual microelectronic packages, the heat sinks 70 would be applied to the heat spreader individually. Each heat sink 70 may be further secured to its corresponding microelectronic package by mounting on a socket 72 via screws 74 (FIG. 3A) or by affixing a clip 76 which is also secured to a circuit board or socket.

In the associated drawings, the microelectronic packages are illustrated as a Flip Chip Molded Matrix Array Package (FCMMAP), but embodiments of the invention may be applicable to other types of packaging with suitable modifications.

As expectations in thermal performance of microelectronic devices increase, embodiments of the invention provide a microelectronic package having improved thermal performance and yet are easy to manufacture. Risk of die cracking and chipping is eliminated with the arrangement of a suitable thermal interface material between the heat spreader and the die. Further, with the provision of an anchor portion in the heat spreader, coupling of the heat spreader in the molded package is reinforced. If required, a heat sink may be coupled in thermal communication with the heat spreader.

Other embodiments will be apparent to those skilled in the art from consideration of the specification and practice of the present invention. Furthermore, certain terminology has been used for the purposes of descriptive clarity, and not to limit the invention. The embodiments and features described above should be considered exemplary, with the invention being defined by the appended claims.

What is claimed is:

1. A microelectronic package comprising:
    a die having a first surface being electrically coupled to a substrate;
    a first thermal interface material thermally coupled to a surface opposite to the first surface of the die;
    a heat spreader comprising:
        a planar heat dissipation portion having a first portion of a bottom surface thermally coupled to the first thermal interface material; and
        an anchor portion comprising an arm extending from a second portion of the bottom surface, the arm being detached from the substrate and forming an open recess; and
    a mold material encapsulating the die and the first thermal interface material, the mold material filling the open recess and leaving at least a top surface of the heat dissipation portion unencapsulated.

2. The microelectronic package of claim 1, wherein the top surface of the heat dissipation portion is substantially flush with an adjacent surface of the mold material.

3. The microelectronic package of claim 1, wherein the top surface of the heat dissipation portion protrudes from an adjacent surface of the mold material.

4. The microelectronic package of claim 1, further comprising:
    a second thermal interface material thermally coupled with the top surface of the heat dissipation portion;
    an external heat sink thermally coupled with the second thermal interface material; and
    a securing device to secure the external heat sink to the microelectronic package.

5. The microelectronic package of claim 4, wherein the securing device is a clip, or a socket configured to receive a mounting screw.

6. A method of forming microelectronic packages, comprising:
    coupling a plurality of dies to a substrate panel;
    providing an underfill material between the dies and the substrate panel;
    disposing a first thermal interface material on the dies;
    disposing a plurality of heat spreaders on the first thermal interface material, wherein the heat spreaders each comprises:
        a planar heat dissipation portion having a first portion of a bottom surface thermally coupled to the first thermal interface material; and
        an anchor portion comprising an arm extending from a second portion of the bottom surface, the arm being detached from the substrate and forming an open recess;
    curing the first thermal interface material to couple the heat spreaders to the dies; and
    encapsulating the dies and the first thermal interface material, and filling the open recess, with a layer of mold material leaving at least a top surface of the heat dissipation portion unencapsulated.

7. The method of claim 6, wherein the top surface of the heat dissipation portion for each of the heat spreader is substantially flush with an adjacent surface of the mold material.

8. The method of claim 6, wherein the top surface of the heat dissipation portion for each of the heat spreader protrudes from an adjacent surface of the mold material.

9. The method of claim 6, further comprising:
    singulating the microelectronic packages by cutting the substrate panel between the dies.

10. The method of claim 9, further comprising:
    disposing a second thermal interface material on the top surface of the heat dissipation portion for each of the heat spreaders;
    disposing an external heat sink on the second thermal interface material; and
    securing the external heat sink to a corresponding one of the microelectronic packages.

11. The method of claim 10, wherein securing the external heat sink includes affixing to the corresponding one of the microelectronic packages a clip secured to a circuit board.

12. The method of claim 10, wherein securing the external heat sink includes mounting the external heat sink to a socket via a screw.

* * * * *